United States Patent
Hattori et al.

(10) Patent No.: US 9,190,582 B2
(45) Date of Patent: Nov. 17, 2015

(54) LIGHT EMITTING DEVICE

(71) Applicant: Kabushiki Kaisha Toshiba, Minato-ku (JP)

(72) Inventors: Yasushi Hattori, Kanagawa (JP); Masahiro Kato, Kanagawa (JP); Yumi Fukuda, Tokyo (JP); Iwao Mitsuishi, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/203,982

(22) Filed: Mar. 11, 2014

(65) Prior Publication Data

US 2014/0299904 A1     Oct. 9, 2014

(30) Foreign Application Priority Data

Apr. 3, 2013   (JP) ................. 2013-078015

(51) Int. Cl.
| | |
|---|---|
| *H01L 29/22* | (2006.01) |
| *H01L 33/50* | (2010.01) |
| *C09K 11/08* | (2006.01) |
| *H05B 33/14* | (2006.01) |

(Continued)

(52) U.S. Cl.
CPC .......... *H01L 33/504* (2013.01); *C09K 11/0883* (2013.01); *C09K 11/7721* (2013.01); *H05B 33/14* (2013.01); *H01L 33/507* (2013.01); *H01L 33/54* (2013.01); *H01L 33/56* (2013.01); *Y02B 20/181* (2013.01)

(58) Field of Classification Search
CPC ... H01L 33/502; H01L 33/504; H01L 33/507; H01L 33/54; H01L 33/56
USPC .......... 257/98, 97, 99, 88, E33.061, E33.067; 438/22, 27; 313/503, 502, 501
See application file for complete search history.

(56) References Cited

U.S. PATENT DOCUMENTS 8,021,576 B2 *   9/2011   Shimizu et al. ........ 252/301.4 R
2006/0208262 A1   9/2006   Sakuma et al.

(Continued)

FOREIGN PATENT DOCUMENTS

| EP | 1 710 291 A2 | 10/2006 |
|---|---|---|
| EP | 1 710 291 A3 | 10/2006 |

(Continued)

OTHER PUBLICATIONS

Office Action issued on Jan. 6, 2015 in the corresponding Korean Patent Application No. 10-2014-22543 (with English Translation).

(Continued)

*Primary Examiner* — Michael Trinh
(74) *Attorney, Agent, or Firm* — Oblon, McClelland, Maier & Neustadt, L.L.P.

(57) ABSTRACT

A light emitting device according to embodiments includes a light emitting element emitting light having a peak wavelength of 425 nm or more and 465 nm or less, a first phosphor emitting light having a peak wavelength of 485 nm or more and 530 nm or less, a second phosphor emitting light having a peak wavelength longer than that of the first phosphor, and a third phosphor emitting light having a peak wavelength longer than that of the second phosphor. Then, when the peak wavelength of the light emitting element is $\lambda_0$ (nm) and the peak wavelength of the first phosphor is $\lambda_1$ (nm), a relation of $30 \leq \lambda_1 - \lambda_0 \leq 70$ is satisfied.

15 Claims, 5 Drawing Sheets

(51) Int. Cl.
*C09K 11/77* (2006.01)
*H01L 33/56* (2010.01)
*H01L 33/54* (2010.01)

(56) References Cited

U.S. PATENT DOCUMENTS

| | | |
|---|---|---|
| 2007/0228949 A1 | 10/2007 | Maruyama et al. |
| 2009/0014741 A1 | 1/2009 | Masuda et al. |
| 2009/0058256 A1 | 3/2009 | Mitsuishi et al. |
| 2009/0236963 A1 | 9/2009 | Nagatomi et al. |
| 2009/0243467 A1 | 10/2009 | Shimizu et al. |
| 2010/0013375 A1 | 1/2010 | Maruyama et al. |
| 2011/0101851 A1 | 5/2011 | Mitsuishi et al. |
| 2012/0056224 A1 | 3/2012 | Mitsuishi et al. |
| 2012/0056225 A1* | 3/2012 | Mitsuishi et al. ............ 257/98 |
| 2012/0056256 A1 | 3/2012 | Mikasa |
| 2012/0056527 A1 | 3/2012 | Mitsuishi et al. |
| 2012/0056528 A1* | 3/2012 | Kato et al. ............ 313/503 |
| 2012/0286646 A1* | 11/2012 | Sakuta et al. ............ 313/501 |
| 2013/0050980 A1 | 2/2013 | Kato et al. |

FOREIGN PATENT DOCUMENTS

| | | |
|---|---|---|
| EP | 2 426 745 A2 | 3/2012 |
| EP | 2 426 745 A3 | 3/2012 |
| JP | 2007-266579 | 10/2007 |
| JP | 2007-294895 | 11/2007 |
| JP | 2008-120949 | 5/2008 |
| JP | 2009-19163 | 1/2009 |
| JP | 2012-188640 | 10/2012 |
| JP | 2013-43937 | 3/2013 |
| KR | 10-2012-0025956 | 3/2012 |
| WO | WO 2006/093298 A1 | 9/2006 |

OTHER PUBLICATIONS

Extended European Search Report issued Jul. 10, 2014, in European Patent Application No. 14156322.1
Taiwanese Office Action dated May 18, 2015, issued in Taiwanese Patent Application No. 103106485 (with English translation).
Korean Office Action issued Sep. 24, 2015 in Patent Application No. 10-2014-0022543 with English translation, 11 pages.

* cited by examiner

LIGHT EMITTING DEVICE

CROSS-REFERENCE TO RELATED APPLICATION

This application is based upon and claims the benefit of priority from Japanese Patent Application No. 2013-078015, filed on Apr. 3, 2013, the entire contents of which are incorporated herein by reference.

FIELD

Embodiments described herein relate generally to a light emitting device.

BACKGROUND

A light emitting device using a light emitting diode (LED) is made generally of a combination of an LED chip as an excitation light source and a phosphor which is excited by the excitation light. Depending on kinds of the LED chip and the phosphor, various luminous colors can be realized.

For a white LED light emitting device emitting white light, for an example, a combination of a blue LED emitting blue light with a phosphor has been used. As the phosphor, a yellow phosphor is mainly used because the yellow color is a complementary color of a blue color. As another example, there is a white LED using the combination of the blue LED emitting the blue light with at least two phosphors selected from a green phosphor, a yellow phosphor, and a red phosphor.

With respect to the white light emitting device, in order to achieve a color close to that of natural light, it is desired to realize a high color rendering property, in particular, a high average color rendering index (Ra).

DETAILED DESCRIPTION

A light emitting device according to embodiments includes a light emitting element emitting light having a peak wavelength of 425 nm or more and 465 nm or less, a first phosphor emitting light having a peak wavelength of 485 nm or more and 530 nm or less, a second phosphor emitting light having a peak wavelength longer than that of the first phosphor, and a third phosphor emitting light having a peak wavelength longer than that of the second phosphor. Then, when the peak wavelength of the light emitting element is $\lambda_0$ (nm) and the peak wavelength of the first phosphor is $\lambda_1$ (nm), the relation of $30 \leq \lambda_1 - \lambda_0 \leq 70$ is satisfied.

In this specification, the peak wavelength of the light emitting element and the phosphor is a wavelength having a maximum light intensity in distribution of light emitted from the light emitting element and the phosphor. In addition, peak intensity is a light intensity at the peak wavelength. Further, the peak wavelength and the light intensity can be measured using a light spectrum analyzer or a light power meter, which are well known.

Embodiments will be described below with reference to the drawings.

(First Embodiment)

A light emitting device according to a first embodiment includes a light emitting element emitting light having a peak wavelength of 425 nm or more and 465 nm or less, a first phosphor emitting light having a peak wavelength of 485 nm or more and 530 nm or less, a second phosphor emitting light having a peak wavelength longer than that of the first phosphor, and a third phosphor emitting light having a peak wavelength longer than that of the second phosphor. Then, when the peak wavelength of the light emitting element is $\lambda_0$ (nm) and the peak wavelength of the first phosphor is $\lambda_1$ (nm), the relation of $30 \leq \lambda_1 - \lambda_0 \leq 70$ is satisfied.

Figure 1:
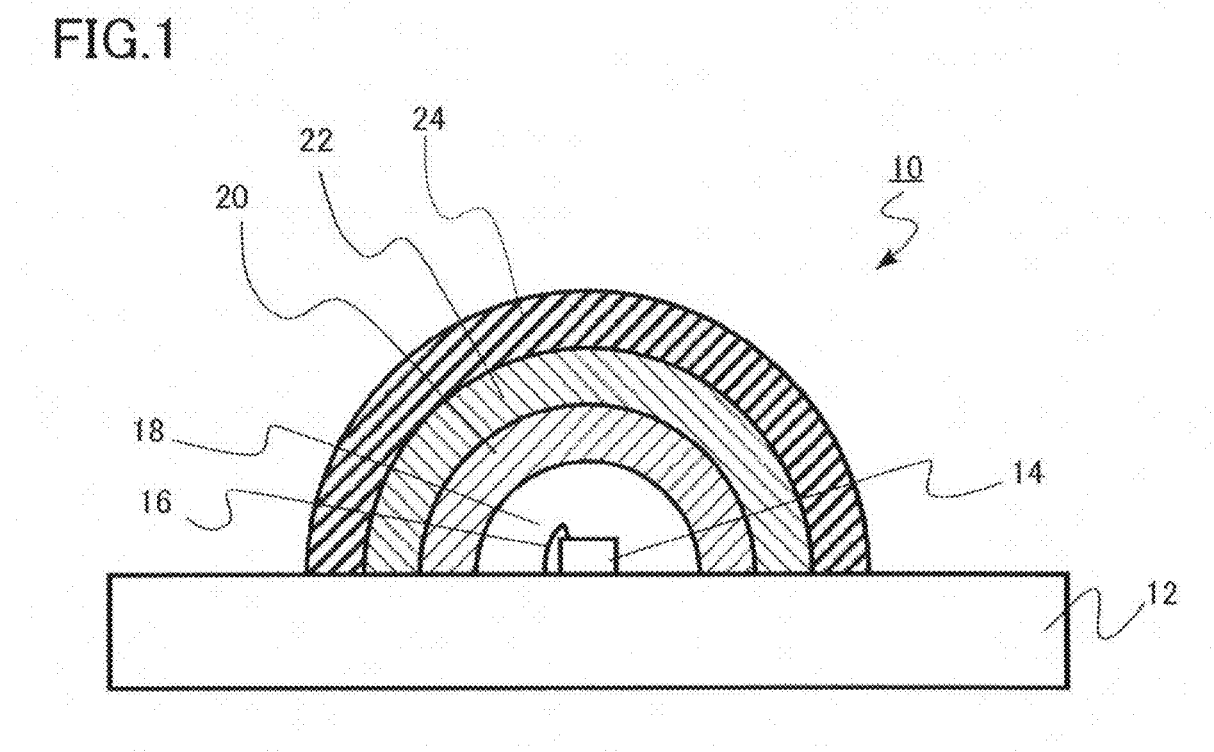
FIG. 1 is a cross-sectional view schematically illustrating a light emitting device according to a first embodiment.

FIG. 1 is a cross-sectional view schematically illustrating the light emitting device according to the first embodiment. A light emitting device 10 is a white light emitting device that emits white light. In particular, the light emitting device 10 is a white light emitting device (white LED) in which an emission color becomes a neutral white color having a color temperature of 4600 K or higher and 5400 K or lower.

The white light emitting device 10 includes a substrate 12 having a plane surface on which a light emitting element is mounted. The substrate 12 is made of, for example, a high reflection material.

Then, for example, a blue LED is mounted on the plane surface of the substrate 12, as a light emitting element 14 that emits light having a peak wavelength of 425 nm or more and 465 nm or less. The blue LED is connected to an interconnection on the substrate 12, which is not illustrated, through a gold wire 16, for example. Then, a driving current is supplied to the blue LED from an outside through the interconnection, and thus the blue LED generates blue light for excitation.

For example, the blue LED is an AlGaInN-based LED in which an emission layer is formed of GaInN.

A hemispherical element sealing transparent layer 18 made of a transparent resin is provided on the light emitting element 14. For example, a silicone resin is used as the transparent resin.

Furthermore, a first phosphor layer 20 is formed to cover the element sealing transparent layer 18. The outer circumference of the first phosphor layer 20 has a semicircular shape in a section perpendicular to the plane surface. The first phosphor layer 20 contains a third phosphor which makes use of light emitted from the light emitting element 14, as excitation light, to emit light having a peak wavelength of 580 nm or more and less than 660 nm.

The third phosphor is a red phosphor. The first phosphor layer 20 is formed by, for example, dispersing particles of the red phosphor into, for example, a transparent silicone resin. The first phosphor layer 20 absorbs blue light generated from the blue LED to convert the blue light into red light.

A second phosphor layer 22 is formed to cover the first phosphor layer 20. The outer circumference of the second phosphor layer 22 has a semicircular shape in the section perpendicular to the plane surface. The second phosphor layer 22 contains a second phosphor which makes use of light emitted from the light emitting element 14, as the excitation light, to emit light having a peak wavelength which is shorter than the peak wavelength of the first phosphor.

The second phosphor is a yellow phosphor. The second phosphor layer 22 is formed by, for example, dispersing particles of the yellow phosphor into, for example, the transparent silicone resin. The second phosphor layer 22 absorbs the blue light generated from the blue LED to convert the blue light into yellow light. The peak wavelength emitted from the second phosphor is equal to or more than 530 nm and less than 580 nm.

A third phosphor layer 24 is formed to cover the second phosphor layer 22. The outer circumference of the third phosphor layer 24 has a semicircular shape in the section perpendicular to the plane surface. The third phosphor layer 24 contains the first phosphor which makes use of the light emitted from the light emitting element 14, as the excitation light, to emit light having a peak wavelength which is shorter than the peak wavelength of the first phosphor and the second phosphor.

The first phosphor is a green phosphor. The third phosphor layer 24 is formed by, for example, dispersing particles of the green phosphor into, for example, the transparent silicone resin. The third phosphor layer 24 absorbs the blue light generated from the blue LED to convert the blue light into green light. The peak wavelength emitted from the first phosphor is 485 nm or more and 530 nm or less.

In addition, when the peak wavelength of the light emitting element is $\lambda_0$ (nm) and the peak wavelength of the first phosphor is $\lambda_1$ (nm), the relation of the $30 \leq \lambda_1 - \lambda_0 \leq 70$ is satisfied.

The second phosphor emits light having the peak wavelength longer than that of the first phosphor, and the third phosphor emits light having the peak wavelength longer than that of the second phosphor.

The white light emitting device 10 according to the first embodiment is provided with the above configuration, and thus being capable of achieving excellent color rendering property having an average color rendering index (Ra) of 95 or more.

Figure 2:
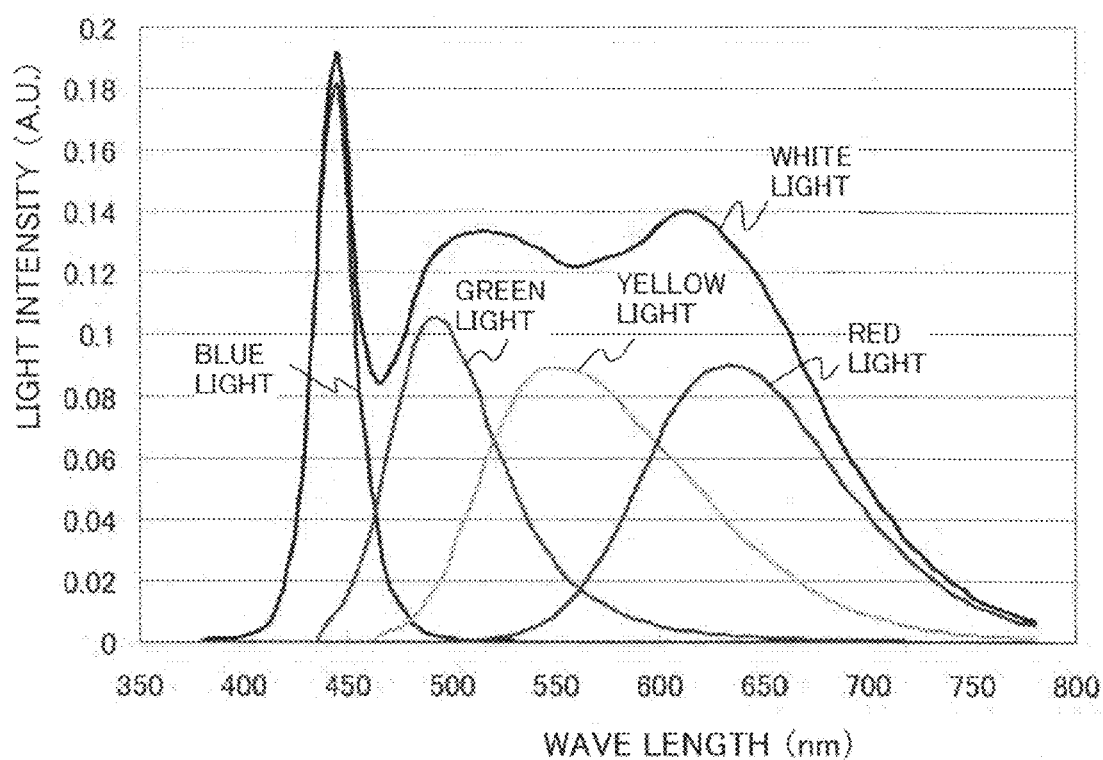
FIG. 2 is a diagram illustrating simulation results of an emission spectrum of the light emitting device according to the first embodiment.

FIG. 2 is a diagram illustrating an example of simulation results of an emission spectrum of the light emitting device according to the first embodiment. The simulation has been performed by adding both spectrums based on a spectrum of the measured blue LED and a spectrum of each phosphor excited by the measured blue LED.

With respect to the spectrum of the given blue LED, a ratio of peak intensity of each phosphor is adjusted by varying the peak wavelength of the green phosphor such that chromaticity of the total spectrum becomes a 5000 K neutral white color (Cx=0.3452, Cy=0.3517).

FIG. 2 illustrates a case where the peak wavelength $\lambda_0$ of the excitation light emitted from the blue LED is 445 nm. In this case, the peak wavelength $\lambda_1$ of the green phosphor (first phosphor) is 490 nm, the peak wavelength of the yellow phosphor (second phosphor) is 550 nm, and the peak wavelength of the red phosphor (third phosphor) is 630 nm. In addition, the ratio of a peak area of the yellow phosphor relative to the sum of the peak area of the yellow phosphor and a peak area of the green phosphor ((peak area of yellow phosphor)/(peak area of yellow phosphor+peak area of green phosphor); hereinafter, simply referred to as a ratio Y/(Y+G)) is 0.60. In this case, a lumen equivalent is 271 lm/W and Ra is 98. The peak area is an area which is calculated by separating overlapped peaks into each component.

Figure 3:
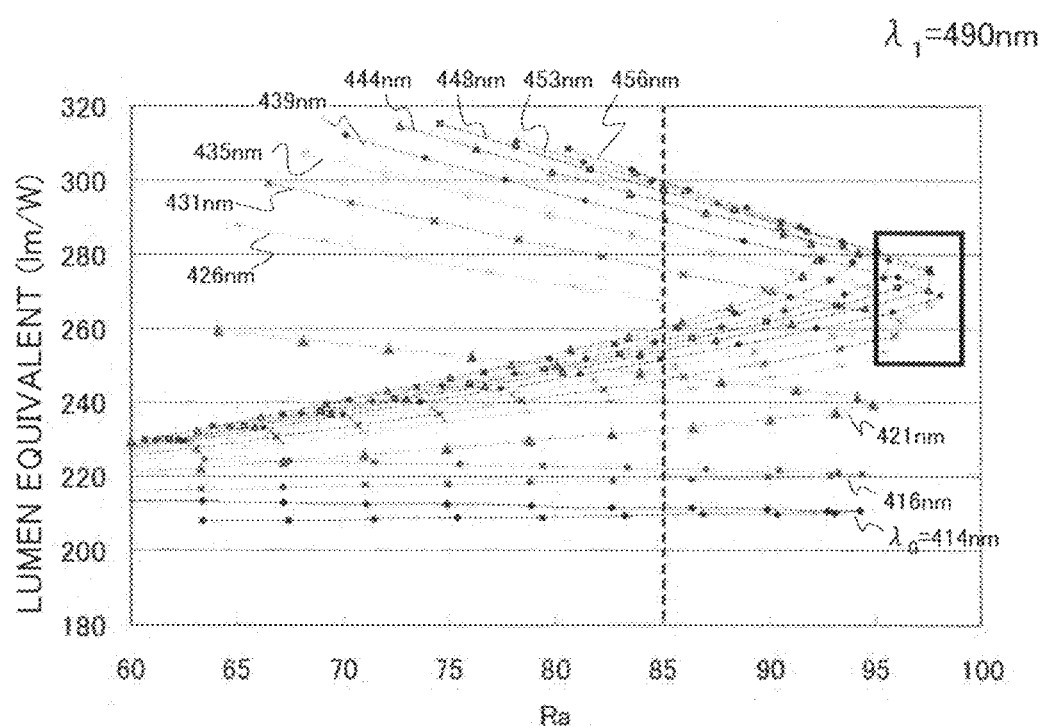
FIG. 3 is a diagram illustrating wavelength dependency of Ra and a lumen equivalent of the light emitting device according to the first embodiment.

FIG. 3 is a diagram illustrating wavelength dependency of Ra and the lumen equivalent of the light emitting device according to the first embodiment. The lumen equivalent is a theoretical value of luminous efficiency.

FIG. 3 illustrates a case where the peak wavelength $\lambda_1$ of the green phosphor (first phosphor) is 490 nm. In this case, the peak wavelength of the yellow phosphor (second phosphor) is 550 nm, and the peak wavelength of the red phosphor (third phosphor) is 630 nm. Then, a simulation is performed such that the chromaticity becomes the 5000 K neutral white color by changing the peak wavelength $\lambda_0$ of the blue LED and then varying the ratio Y/(Y+G) for each peak wavelength $\lambda_0$, and thus obtained results are illustrated in FIG. 3. Further, the ratio of a peak area of the red phosphor relative to the sum of the peak area of the yellow phosphor and the peak area of the green phosphor is also adjusted such that the chromaticity of the total spectrum becomes the 5000 K neutral white color of (Cx=0.3452, Cy=0.3517).

In addition, if the peak wavelength of the yellow phosphor (second phosphor) is in the range of 530 nm or more and less than 580 nm and the peak wavelength of the red phosphor (third phosphor) is in the range of 580 nm or more and less than 660 nm, the change in Ra is small. Therefore, the peak wavelength of the yellow phosphor (second phosphor) is fixed at 550 nm, and the peak wavelength of the red phosphor (third phosphor) is fixed at 630 nm. That is, since the yellow phosphor (second phosphor) has a relatively large half-value width, it has a small effect on Ra of wavelength variation. Further, in the range where the color temperature is 4600 K or higher and 5400 K or lower, only a small amount of the red phosphor (third phosphor) is used. In this range of the color temperature, because only a small amount of the red phosphor is used, the red phosphor has a small effect on Ra.

In addition, when the peak wavelengths of the light emitting element and the green phosphor satisfy the above conditions, the peak wavelength of the yellow phosphor (second phosphor) is preferably 535 nm or more and 565 nm or less from the viewpoint of increasing Ra. Further, for the same reason, the peak wavelength of the red phosphor (third phosphor) is preferably 615 nm or more and 645 nm or less.

In FIG. 3, Ra is 95 or more in a region surrounded by a black frame, and thereby realizing a high color rendering property. The same simulation as used for obtaining the results illustrated in FIG. 3 is performed by varying the peak wavelength $\lambda_1$ of the green phosphor (first phosphor). Then, the conditions required to realize Ra 95 or more have been figured out.

Figure 4:
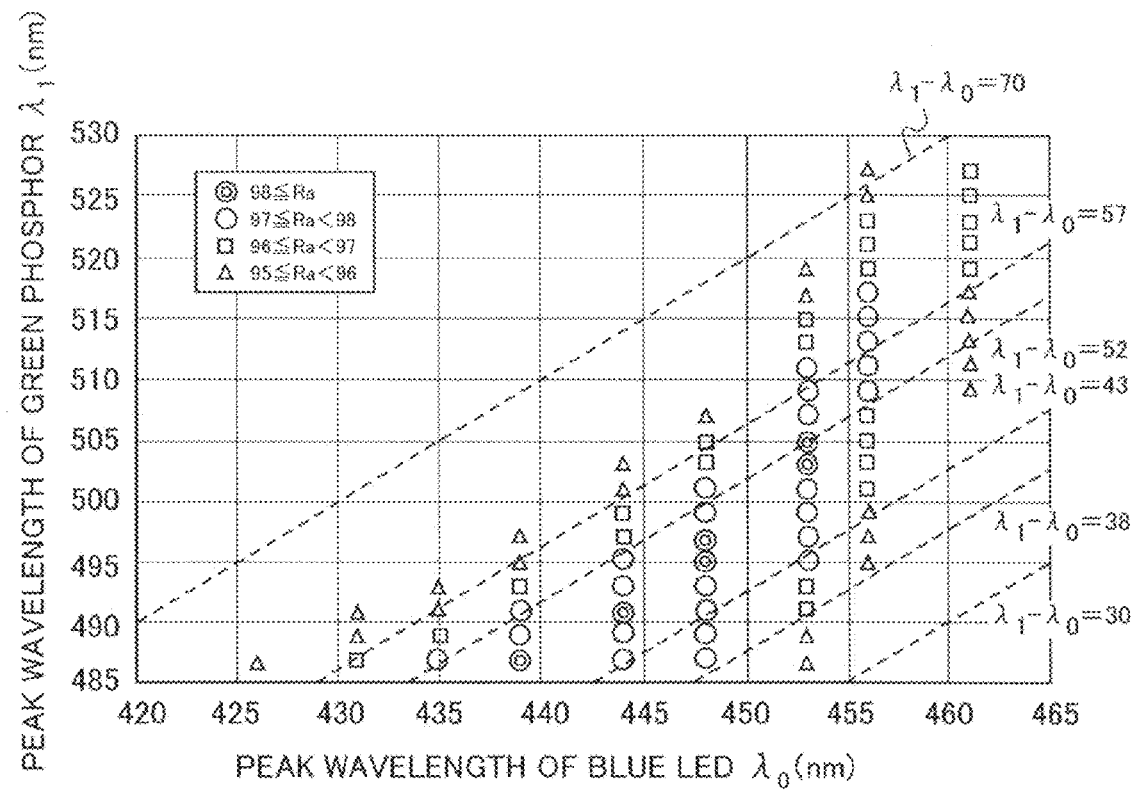
FIG. 4 is a diagram illustrating a relation between a peak wavelength $\lambda_0$ of a blue LED and a peak wavelength $\lambda_1$ of a green phosphor according to the first embodiment.

FIG. 4 is a diagram illustrating a relation between the peak wavelength $\lambda_0$ of the blue LED and the peak wavelength $\lambda_1$ of the green phosphor in a case where Ra of 95 or more is realized. Dashed lines satisfy the equation of $\lambda_1 - \lambda_0 = k$.

As illustrated in FIG. 4, when the relation of $30 \leq \lambda_1 - \lambda_0 \leq 70$ is satisfied, Ra of 95 or more is realized. At this time, the relation of $0.15 \leq Y/(Y+G) \leq 0.70$ is satisfied.

In addition, it is preferred to satisfy the relations of $38 \leq \lambda_1 - \lambda_0 \leq 57$ and $\lambda_0 \leq 455$. When these relations are satisfied, Ra of 96 or more is realized. At this time, the relation of $0.30 \leq Y/(Y+G) \leq 0.70$ is satisfied.

In addition, it is more preferred to satisfy the relations of $43 \leq \lambda_1 - \lambda_0 \leq 52$ and $\lambda_0 \leq 455$. When these relations are satisfied, Ra of 97 or more is realized. At this time, the relation of $0.50 \leq Y/(Y+G) \leq 0.65$ is satisfied.

In addition, the first phosphor of the first embodiment is an oxynitride phosphor containing, for example, silicon (Si), aluminum (Al), and strontium (Sr), so-called, a sialon phosphor. This phosphor has substantially the same crystal structure as that of $Sr_3Si_{13}Al_3O_2N_{21}$, and activated by Eu.

A chemical composition of the first phosphor (green phosphor) according to the first embodiment is expressed by the following general formula (1).

$$(M_{1-x1}EC_{x1})_{3-y1}Al_{3+z1}Si_{13-z1}O_{2+u1}N_{21-w1} \quad (1)$$

Here, M represents Sr, and a part of Sr may be substituted with at least one kind selected from Ba, Ca, and Mg.

EC is an element selected from Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi, and Fe.

Further, x1, y1, z1, u1, and w1 satisfy the following relations:

$0<x1\leq 1$, $-0.1\leq y1\leq 0.3$, $-3\leq z1\leq 1$, $-3<u1-w1\leq 1.5$, $0<2+u1$, $0<21-w1$.

When the oxynitride phosphor containing silicon (Si), aluminum (Al), and strontium (Sr) is used as the first phosphor, the range of the peak wavelength of the light emitting element and each phosphor is easily realized. In addition, the high luminous efficiency can be easily realized.

Further, the second phosphor (yellow phosphor) of the first embodiment is an oxynitride phosphor containing, for example, silicon (Si), aluminum (Al), and strontium (Sr), so-called, a sialon phosphor. This phosphor has substantially the same crystal structure as that of $Sr_2Si_7Al_3ON_{13}$, and activated by Ce.

A chemical composition of the second phosphor according to the first embodiment is expressed by the following general formula (2).

$(M_{1-x2}Ce_{x2})_{2y}Al_zSi_{10-z}O_uN_w$     (2)

Here, M represents Sr, and a part of Sr may be substituted with at least one kind selected from Ba, Ca, and Mg.

Further, x2, y, z, u, and w satisfy the following relations:

$0<x2\leq 1$, $0.8\leq y\leq 1.1$, $2\leq z\leq 3.5$, $0<u\leq 1$ $1.8\leq z-u$ $0<w$, $13\leq u+w\leq 15$.

When the oxynitride phosphor containing silicon (Si), aluminum (Al), and strontium (Sr) is used as the second phosphor, the high luminous efficiency can be easily realized.

In addition, the third phosphor of the first embodiment is an oxynitride phosphor containing, for example, silicon (Si), aluminum (Al), and strontium (Sr), so-called, a sialon phosphor. This phosphor has substantially the same crystal structure as that of $Sr_2Si_7Al_3ON_{13}$, and activated by Eu.

A chemical composition of the third phosphor (red phosphor) according to the first embodiment is expressed by the following general formula (3).

$(M_{1-x3}EC_x)_aSi_bAlO_cN_d$     (3)

Here, M represents Sr, and a part of Sr may be substituted with at least one kind selected from Ba, Ca, and Mg.

EC is an element selected from Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi, and Fe.

Further, x3, a, b, c, and d satisfy the following relations.

$0<x3<0.4$, $0.55<a<0.80$, $2<b<3$, $0<c\leq 0.6$, $4<d<5$.

When the oxynitride phosphor containing silicon (Si), aluminum (Al), and strontium (Sr) is used as the third phosphor, the high luminous efficiency can be easily realized.

According to the light emitting device of the first embodiment, the white light emitting device having the high color rendering property is realized. In addition, since the blue LED is used as an excitation light source, an ultraviolet component is extremely small. Accordingly, it is possible to suppress the deterioration of constituent parts of the light emitting device due to ultraviolet light and to realize a reliable light emitting device.

(Second Embodiment)

A light emitting device according to a second embodiment is the same as the first embodiment except that first to third phosphors are contained in a resin in a mixed state. Therefore, the description of the same contents as the first embodiment will not be provided.

Figure 5:
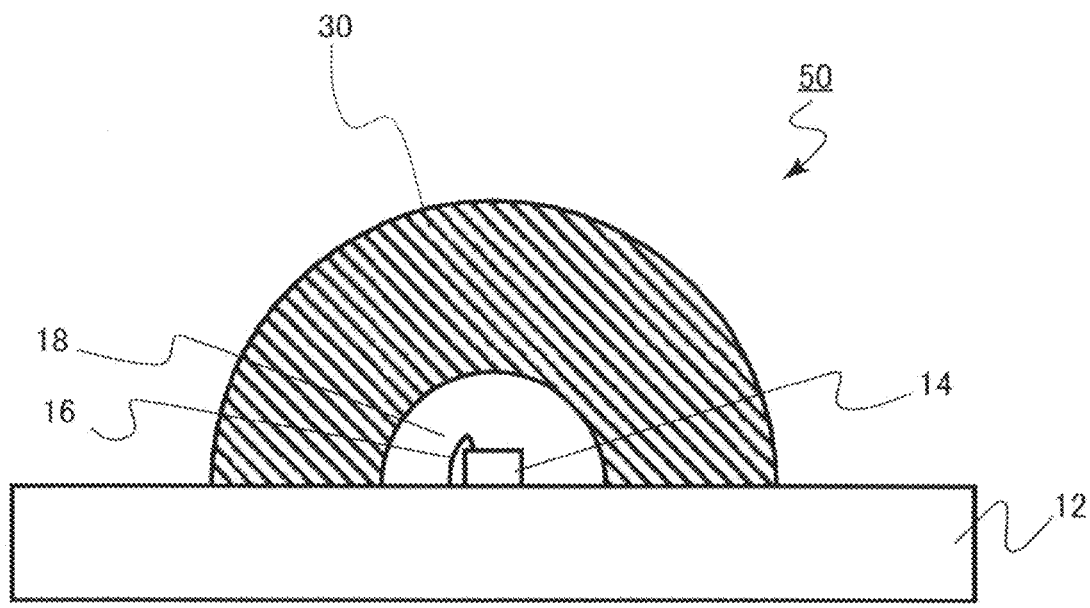
FIG. 5 is a cross-sectional view schematically illustrating a light emitting device according to a second embodiment.

FIG. 5 is a cross-sectional view schematically illustrating the light emitting device according to the second embodiment. A light emitting device 50 is a white light emitting device that emits white light. In particular, the light emitting device 50 is a white light emitting device (white LED) in which an emission color becomes a neutral white color having a color temperature of 4600 K or higher and 5400 K or lower.

A phosphor layer 30 is formed to cover an element sealing transparent layer 18 in the light emitting device 50. The outer circumference of the phosphor layer 30 has a semicircular shape in a section perpendicular to a plane surface. The phosphor layer 30 is formed by, for example, mixing and dispersing particles of a first phosphor (green phosphor), a second phosphor (yellow phosphor), and a third phosphor (red phosphor) into, for example, a transparent silicone resin.

In the light emitting device 50 according to the second embodiment, the first to third phosphors are mixed and contained in the same resin layer. Therefore, as compared with the first embodiment, the phosphor layer 30 can be easily formed.

In the light emitting device according to the second embodiment, all of the first to third phosphors are preferably an oxynitride phosphor containing, for example, silicon (Si), aluminum (Al), and strontium (Sr), so-called, a sialon phosphor. When all of the first to third phosphors are the sialon phosphor, the shape and weight of the particles of each phosphor become close, thereby improving dispersibility and uniformity after the dispersion at the time of forming the phosphor layer 30. Therefore, it is possible to realize the white light emitting device having a uniform emission distribution.

In the embodiments, the case of using an AlGaInN-based LED in which the emission layer is formed of GaInN is described as an example. However, it is possible to use an LED in which the emission layer (active layer) is formed using, for example, aluminum gallium indium nitride (AlGaInN), which is a Group III-V compound semiconductor or magnesium zinc oxide (MgZnO), which is a Group II-VI compound semiconductor.

For example, the Group III-V compound semiconductor used for the emission layer is a nitride semiconductor containing at least one selected from the group including Al, Ga, and In. This nitride semiconductor is specifically represented by $Al_xGa_yIn_{(1-x-y)}N$ ($0 \le x \le 1$, $0 \le y \le 1$, $0 \le (x+y) \le 1$). Examples of such a nitride semiconductor include any of binary semiconductors such as AlN, GaN, and InN; ternary semiconductors such as $Al_xGa_{(1-x)}N$ ($0<x<1$), $Al_xIn_{(1-x)}N$ ($0<x<1$), and $Ga_yIn_{(1-y)}N$ ($0<y \le 1$); and quarternary semiconductors including all of Al, Ga and In. On the basis of the values of x, y, and (1−x−y), which are each related to the composition of Al, Ga or In, an emission peak wavelength is decided within the range of ultraviolet to blue wavelengths. Moreover, the Group III elements may be partially substituted with boron (B), thallium (Tl), or some other element. Furthermore, N, which is a Group V element, may be partially substituted with phosphorus (P), arsenic (As), antimony (Sb), bismuth (Bi), or some other element.

Similarly, the Group II-VI compound semiconductor used for the emission layer may be an oxide semiconductor containing at least one of Mg and Zn. Specifically, the semiconductor may be represented by $Mg_zZn_{1-z}O$ ($0 \le z \le 1$). On the basis of the values of z and (1−z), which are each related to the composition of Mg or Zn, an emission peak wavelength is decided within the range of ultraviolet wavelengths.

Further, with respect to the transparent base material of the phosphor layer, the silicone resin is described as an example. However, the transparent base material of the phosphor layer may be formed of any material which is high in excitation-light transmissibility and high in heat resistance. Examples of the material include, in addition to the silicone resin, epoxy resin, urea resin, fluorine resin, acrylic resin, and polyimide resin. The epoxy resin or silicone resin is in particular preferably used since the resin is easily available, is easily handleable and is inexpensive. The material may be, for example, glass or a sintered body other than resin.

While certain embodiments have been described, these embodiments have been presented by way of example only, and are not intended to limit the scope of the inventions . Indeed, the light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A light emitting device comprising:
a light emitting element emitting light having a peak wavelength of 435 nm or more and 465 nm or less;
a first phosphor emitting light having a peak wavelength of 485 nm or more and 530 nm or less;
a second phosphor emitting light having a peak wavelength longer than that of the first phosphor; and
a third phosphor emitting light having a peak wavelength longer than that of the second phosphor,
wherein when the peak wavelength of the light emitting element is $\lambda_0$ (nm) and the peak wavelength of the first phosphor is $\lambda_1$ (nm), a relation of $30 \le \lambda_1 - \lambda_0 \le 70$ is satisfied,
wherein the first phosphor, the second phosphor, and the third phosphor are oxynitride phosphors containing silicon (Si), Aluminum (Al), and strontium (Sr), respectively, and
wherein the light emitting device emits light having an average color rendering index (Ra) of 95 or more.

2. The device according to claim 1, wherein the device emits light having a color temperature of 4600 K or higher and 5400 K or lower.

3. The device according to claim 1, wherein a relation of $38 \le \lambda_1 - \lambda_0 \le 57$ is satisfied.

4. The device according to claim 1, wherein the first phosphor, the second phosphor, and the third phosphor are contained in a resin.

5. The device according to claim 1, wherein the peak wavelength of the second phosphor is 530 nm or more and less than 580 nm, and the peak wavelength of the third phosphor is 580 nm or more and less than 660 nm.

6. The device according to claim 1, wherein the peak wavelength of the second phosphor is 535 nm or more and 565 nm or less, and the peak wavelength of the third phosphor is 615 nm or more and less than 645 nm.

7. The device according to claim 1, wherein a ratio of a peak area of the second phosphor relative to the sum of the peak area of the first phosphor and a peak area of the second phosphor is 0.15 or more and 0.70 or less.

8. The device according to claim 1, wherein a relation of $38 \le \lambda_1 - \lambda_0 \le 57$ and $\lambda_0 \le 455$ is satisfied, and a ratio of a peak area of the second phosphor relative to the sum of the peak area of the first phosphor and a peak area of the second phosphor is 0.30 or more and 0.70 or less.

9. The device according to claim 1, wherein a relation of $43 \le \lambda_1 - \lambda_0 \le 52$ and $\lambda_0 \le 455$ is satisfied, and a ratio of a peak area of the first phosphor relative to the sum of the peak area of the first phosphor and a peak area of the second phosphor is 0.50 or more and 0.65 or less.

10. The device according to claim 1, wherein
the first phosphor has substantially same crystal structure as that of $Sr_3Si_{13}Al_3O_2N_{21}$ and is activated by Eu,
the second phosphor has substantially same crystal structure as that of $Sr_2Si_7Al_3ON_{13}$ and is activated by Ce, and
the third phosphor has substantially same crystal structure as that of $Sr_2Si_7Al_3ON_{13}$ and is activated by Eu.

11. The device according to claim 10, wherein the first phosphor, the second phosphor, and the third phosphor are contained in a resin.

12. The device according to claim 1, wherein a chemical composition of the first phosphor is expressed by the following general formula (1):

$$(M_{1-x1}EC_{x1})_{3-y1}Al_{3+z1}Si_{13-z1}O_{2+u1}N_{21-w1} \quad (1)$$

where, M is Sr or Sr and an element selected from a group consisting of Ba, Ca, and Mg,
EC is an element selected from a group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi, and Fe, and x1, y1, z1, u1, and w1 satisfy the following relations, $0 < x1 \le 1$, $-0.1 \le y1 \le 0.3$, $-3 \le z1 \le 1$, $-3 < u1 - w1 \le 1.5$, $0 < 2 + u1$, $0 < 21 - w1$.

13. The device according to claim 12, wherein a chemical composition of the second phosphor is expressed by the following general formula (2):

$$(M_{1-x2}Ce_{x2})_{2y}Al_zSi_{10-z}O_uN_w \quad (2)$$

where, M is Sr or Sr and an element selected from a group consisting of Ba, Ca, and Mg, and x2, y, z, u, and w satisfy the following relations, $0 < x2 \leq 1$, $0.8 \leq y \leq 1.1$, $2 \leq z \leq 3.5$, $0 < u \leq 1$ $1.8 \leq z-u$ $0 < w$, $13 \leq u+w \leq 15$.

14. The device according to claim 13, wherein a chemical composition of the third phosphor is expressed by the following general formula (3):

$(M_{1-x3}EC_{x3})_a Si_b AlO_c N_d$ (3)

where, M is Sr or Sr and an element selected from a group consisting of Sr, Ba, Ca, and Mg, EC is an element selected from a group including Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi, and Fe, and X3, a, b, c, and d satisfy the following relations, $0 < x3 < 0.4$, $0.55 < a < 0.80$, $2 < b < 3$, $0 < c \leq 0.6$, $4 < d < 5$.

15. A light emitting device comprising:

a light emitting element emitting light having a peak wavelength of 425 nm or more and 465 nm or less;

a first phosphor emitting light having a peak wavelength of 485 nm or more and 530 nm or less;

a second phosphor emitting light having a peak wavelength longer than that of the first phosphor;

a third phosphor emitting light having a peak wavelength longer than that of the second phosphor, a third phosphor layer;

a second phosphor layer provided between the light emitting element and the third phosphor layer; and a first phosphor layer provided between the light emitting element and the second phosphor layer, wherein when the peak wavelength of the light emitting element is $\lambda_0$(nm) and the peak wavelength of the first phosphor is $\lambda_1$(nm), a relation of $30 \leq \lambda_1 - \lambda_0 \leq 70$ is satisfied, and wherein the third phosphor layer contains the first phosphor, the second phosphor layer contains the second phosphor, and the first phosphor layer contains the third phosphor.

* * * * *